(12) United States Patent
Konno

(10) Patent No.: US 12,312,235 B2
(45) Date of Patent: May 27, 2025

(54) CHANNEL FOR DECREASING DAMPING ASYMMETRY

(71) Applicant: MURATA MANUFACTURING CO., LTD., Nagaokakyo (JP)

(72) Inventor: Akira Konno, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 547 days.

(21) Appl. No.: 17/693,792

(22) Filed: Mar. 14, 2022

(65) Prior Publication Data

US 2022/0306453 A1  Sep. 29, 2022

(30) Foreign Application Priority Data

Mar. 25, 2021  (FI) ...................................... 20215338

(51) Int. Cl.
  *B81B 3/00*  (2006.01)
  *G01P 15/125*  (2006.01)

(52) U.S. Cl.
  CPC .......... *B81B 3/0051* (2013.01); *G01P 15/125* (2013.01); *B81B 2201/0235* (2013.01); *B81B 2203/0136* (2013.01); *B81B 2203/04* (2013.01)

(58) Field of Classification Search
  CPC .......... B81B 3/0051; B81B 2201/0235; B81B 2203/0136; B81B 2203/04; G01P 15/125; G01P 2015/0882
  See application file for complete search history.

(56) References Cited

U.S. PATENT DOCUMENTS

| 6,276,207 B1 | 8/2001 | Sakai et al. |
| 2005/0095833 A1 | 5/2005 | Lutz et al. |
| 2009/0007669 A1* | 1/2009 | Fukaura ................ G01P 1/023 73/514.32 |

(Continued)

FOREIGN PATENT DOCUMENTS

| CN | 106800270 B | 4/2019 |
| JP | 2009014598 A | 1/2009 |

OTHER PUBLICATIONS

European Search Report dated Jul. 4, 2022, corresponding to European Patent Application No. 22154471.

(Continued)

*Primary Examiner* — Thanh T Nguyen
(74) *Attorney, Agent, or Firm* — SQUIRE PATTON BOGGS (US) LLP

(57) ABSTRACT

The present invention relates micro-electromechanical systems (MEMS); in particular to a comb channel structure for decreasing damping asymmetry of comb electrodes used to measure movement of components with MEMS devices. The channel is formed by a series of recesses formed in the comb fingers of the comb electrodes, or in the cap or handle wafer adjacent to the comb fingers. The channel increases the cross sectional area of the path through which gas can move into or out of the space between the comb electrodes as the comb electrodes move with respect to one another. Thus, when there is a damping asymmetry caused by a difference in the distance between the comb electrode and the cap wafer, and the comb electrode and handle wafer, the channel is employed on the side of the comb electrode with the smaller distance to the adjacent wafer to reduce the damping asymmetry.

13 Claims, 3 Drawing Sheets

(56) References Cited

U.S. PATENT DOCUMENTS

| | | |
|---|---|---|
| 2014/0152325 A1 | 6/2014 | Narita |
| 2017/0207748 A1 | 7/2017 | Rinkio |
| 2019/0146003 A1* | 5/2019 | Reinmuth ............ G01P 15/125 73/514.24 |

OTHER PUBLICATIONS

Alexander Sorger et al., "Capacitive Sensing Electrodes with Reduced Squeeze-Film Damping," In: 2017 19th International Conference on Solid-State Sensors, Actuators and Microsystems (Transducers), IEEE, Jun. 18, 2017, pp. 1033-1036.

Office Action dated Feb. 28, 2023, corresponding to Japanese Patent Application No. 2022-038937.

Finnish Search Report dated Nov. 12, 2021 corresponding to Finnish Patent Application No. 20215338.

* cited by examiner

CHANNEL FOR DECREASING DAMPING ASYMMETRY

TECHNICAL FIELD

The present invention relates to the field of micro-electromechanical systems (MEMS) and more specifically to a channel structure for decreasing damping asymmetry of comb electrodes used to measure movement of components with MEMS devices.

BACKGROUND

In inertial MEMS sensors, such as accelerometers, movement of one or more proof masses within the sensors are measured using comb capacitors. Each electrode of the comb capacitors is generally shaped like a comb, having a plurality of comb fingers which extend in the same direction. The fingers of each electrode are interdigitated and separated by a gap, thereby forming a capacitor. One of the comb electrodes is fixed with respect to the MEMS sensor package, while the other, which is fixed with respect to the proof mass, is permitted to move along an axis parallel to the comb fingers relative to the fixed electrode. As the moveable electrode moves closer to or further away from the fixed electrode, the capacitance of the capacitor changes in relation to the movement. Thus, movement of the proof mass, e.g. due to external acceleration, can be measured by measuring the changing capacitance of the comb capacitor. However, other factors than the quantity that is being measured, e.g. acceleration, can affect the movement of the moveable electrode. One such factor is damping of the movement of the moveable electrode due to gas pressure within the gap between the electrode. When the space "above" and the space "below" the comb electrodes are not equal, movement of the moveable comb electrode causes asymmetrical pressure at the top and bottom of the comb electrodes, which leads to movement of the comb electrode out of the intended movement axis, negatively affecting the accuracy of the measurement of proof mass movement.

SUMMARY

According to a first aspect of the invention, a MEMS device is provided. The MEMS device comprises at least one comb capacitor and the comb capacitor comprises a moveable electrode, the moveable electrode being moveable relative to fixed components of the MEMS device, the moveable electrode comprising a plurality of comb fingers and a fixed electrode, the fixed electrode being fixed relative to other fixed components of the MEMS device, the fixed electrode comprising a plurality of comb fingers, wherein the comb fingers of the moveable electrode are interdigitated with the comb fingers of the fixed electrode. The MEMS device also comprises a handle wafer and a cap wafer, the handle wafer and the cap wafer being located on opposite sides of the moveable and fixed electrodes and extending parallel to the comb fingers of the moveable and fixed electrodes. Sides of the comb fingers of the moveable and fixed electrodes opposite the cap wafer or the handle wafer include recesses and/or the cap wafer or handle wafer includes a recess opposite the comb fingers of the movable and fixed electrodes, wherein the recess or recesses provide a channel through which gas can move into or out of the space between the moveable electrode and fixed electrode and to or from the interior space of the MEMS device surrounding the comb capacitor.

The comb fingers of the moveable and fixed electrodes may include recesses and the recesses may be positioned on every comb finger of the comb capacitor such the grooves overlap along an axis perpendicular to the longitudinal axes of the comb fingers to provide the channel, and so that the channel runs across the full width of the comb electrode fingers perpendicular to the longitudinal axes of the comb fingers.

When the gap between the comb capacitor electrodes and the cap wafer is smaller than the gap between the comb capacitor electrodes and the handle wafer, the recesses may be formed on the sides of the comb capacitor fingers opposite the cap wafer.

When the gap between the comb capacitor electrodes and the handle wafer is smaller than the gap between the comb capacitor electrodes and the cap wafer, the recesses may be formed on the sides of the comb capacitor fingers opposite the handle wafer.

When the recess is formed in the cap wafer or the handle wafer, the recess may extend across the cap wafer or handle wafer opposite the comb capacitor fingers across at least the full width of the comb capacitor fingers and perpendicular to the longitudinal axes of the comb capacitor fingers.

When the gap between the comb capacitor electrodes and the cap wafer is smaller than the gap between the comb capacitor electrodes and the handle wafer, the recess may be formed on the cap wafer.

When the gap between the comb capacitor electrodes and the handle wafer is smaller than the gap between the comb capacitor electrodes and the cap wafer, the recess may be formed on the handle wafer.

The comb fingers of the moveable and fixed electrodes may include second recesses and/or the cap wafer or handle wafer may include a second recess, wherein the second recess or second recesses provide a second channel through which gas can move in or out of the space between the moveable electrode and fixed electrode and to or from the interior space of the MEMS device surrounding the comb capacitor, and wherein the second channel extends parallel to and is offset from the first channel.

The comb capacitor may, for example, be a damping capacitor or a sense capacitor.

Both the comb fingers of the moveable and fixed electrodes may include recesses and the cap wafer or handle wafer may include a recess, and the recess in the cap wafer or handle wafer may be positioned opposite the recesses in the comb fingers of the moveable and fixed electrodes such that the recesses in the comb fingers and the recess in the cap or handle wafer form the channel.

The MEMS device may comprises a plurality of comb capacitors and two or more of the comb capacitors may comprise a moveable electrode, the moveable electrode being moveable relative to fixed components of the MEMS device, the moveable electrode comprising a plurality of comb fingers, a fixed electrode, the fixed electrode being fixed relative to other fixed components of the MEMS device, the fixed electrode comprising a plurality of comb fingers, wherein the comb fingers of the moveable electrode are interdigitated with the comb fingers of the fixed electrode, and a handle wafer and a cap wafer, the handle wafer and the cap wafer being located on opposite sides of the moveable and fixed electrodes and extending parallel to the comb fingers of the moveable and fixed electrodes; wherein the comb fingers of the moveable and fixed electrodes include recesses and/or the cap wafer or handle wafer includes a recess, wherein the recess or recesses provide a channel through which gas can move in or out of the space between the moveable electrode and fixed electrode and to or from the interior space of the MEMS device surrounding the comb capacitor.

DETAILED DESCRIPTION

Figure 1:
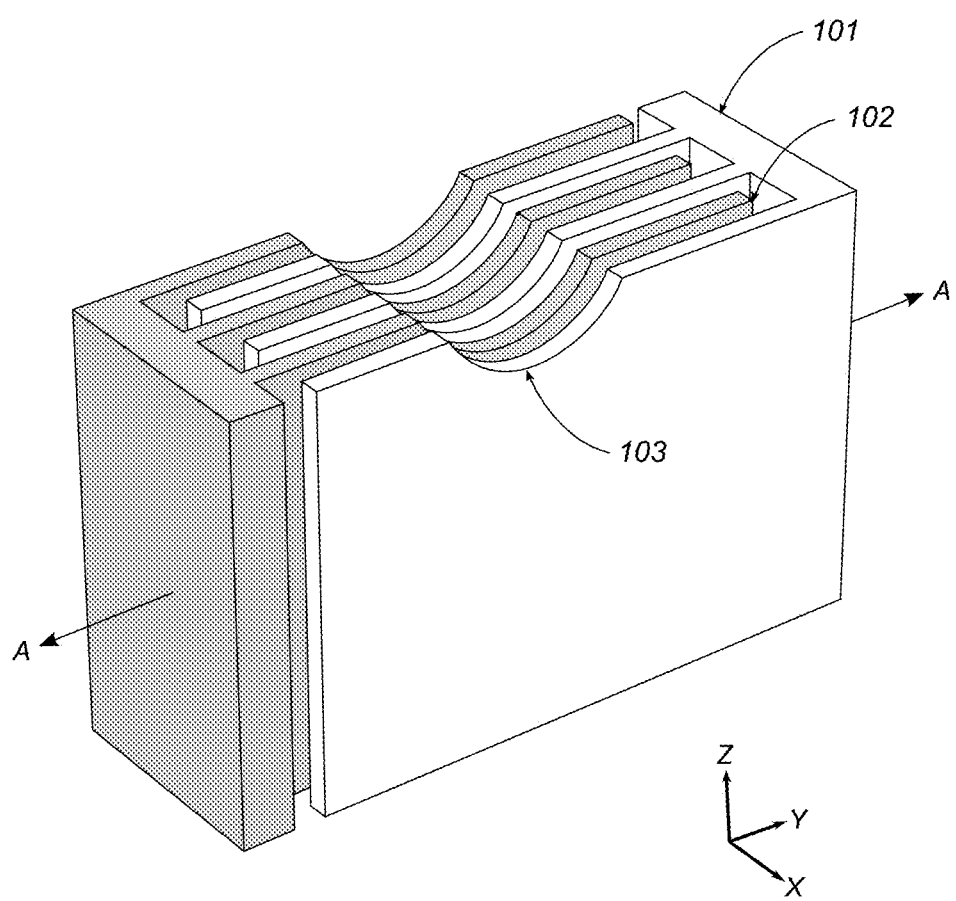
FIG. 1 shows an example of the recesses in the comb electrodes.

FIG. 1 shows an example of a recess in the comb electrodes according to an embodiment of the present invention. Sections of a fixed comb electrode 101 and moveable comb electrode 102 are shown. The fingers of the comb electrode extend along the Y-axis, as shown in FIG. 1, and are spaced apart along the X-axis. In the context of the present invention, the vertical axis is considered to be the Z-axis as depicted in FIG. 1, i.e. the axis perpendicular to the axis along which the comb fingers extend and along which the comb fingers are distributed. The terms "above", "below", "top" and "bottom" refer to relative positions along the Z-axis, i.e. the vertical direction.

The moveable comb electrode 102 is configured to move perpendicular to the axis A-A, parallel to the X-axis, relative to the fixed comb electrode 101. A plurality of recesses 103 are located in each comb finger of the fixed comb electrode 101 and moveable comb electrode 102. In the embodiment of FIG. 1, the recesses 103 are located top of the comb fingers of the fixed 101 and moveable 102 comb electrodes. In alternative embodiments, the recesses 103 may be located at the bottom of the comb fingers. The recesses 103 form a channel that extends through the comb fingers from one side of the comb electrode to the other. While it is not essential for the channel to run perpendicularly to the comb fingers, when the channel runs perpendicularly to the comb fingers, the symmetrical arrangement of the channel and comb fingers does not introduce asymmetric forces on the moveable comb electrode which might negatively affect measurement and control. It is therefore preferable for the recesses 103 to be arranged such that the channel they form runs perpendicularly to the comb fingers of comb electrodes 101, 102.

Not shown in FIG. 1 are the cap wafer and handle wafer. The cap wafer is located above the comb electrodes 101, 102, and the handle wafer is located below the comb electrodes 101, 102. The distance between the top of the comb electrodes 101, 102 and the bottom of the cap wafer may be smaller or larger than the distance between the bottom of the comb electrodes 101, 102 and the top of the handle wafer. In conventional structures, this causes a pressure difference between the top and bottom of the comb electrodes 101, 102. In operation, such pressure difference tends to move the movable comb electrode 102 along the Z-axis and cause undesired error to the measurement, control or damping function of the comb electrode.

In the example shown in FIG. 1, the bottom of the cap wafer is smaller than the distance between the bottom of the comb electrodes 101, 102 and the top of the handle wafer. However, the channel formed by recesses 103 increases the cross-sectional area of the channel between the cap wafer and the comb electrodes 101, 102 through which gas is drawn in or escapes from the changing volume between the fixed 101 and moveable 102 comb electrodes. This increased channel size decreases the effect of the asymmetry of the gaps between the comb electrodes 101, 102 and the cap wafer and between the comb electrodes 101, 102 and the handle wafer, and thereby reduces the induced movement of the moveable comb electrode 102 along the Z-axis due to the pressure difference between the top and bottom of the comb electrodes 101, 102. This improves the accuracy of the measurement of the X-axis movement of the moveable comb electrode 102 relative to the fixed comb electrode 101, when the comb capacitor is used for measurement, or improves control of the X-axis movement of the moveable comb electrode, where the comb capacitor is used for control or damping.

The sections 101, 102 and recess 103 shown in FIG. 1 are small sections of larger combs that extend along the Y-axis in one or both directions. The recesses 103 extends across all of the comb fingers of the comb electrodes 101, 102 such that the channel formed by the recesses 103 is connected with the space surrounding the comb electrodes 101, 102.

The channel formed by the recesses 103 may still be used even when there is already a recess present in the cap (or handle wafer) adjacent to the combs, e.g. to allow rotation of a structure out of the plane of the cap (or handle wafer).

Figure 2A:
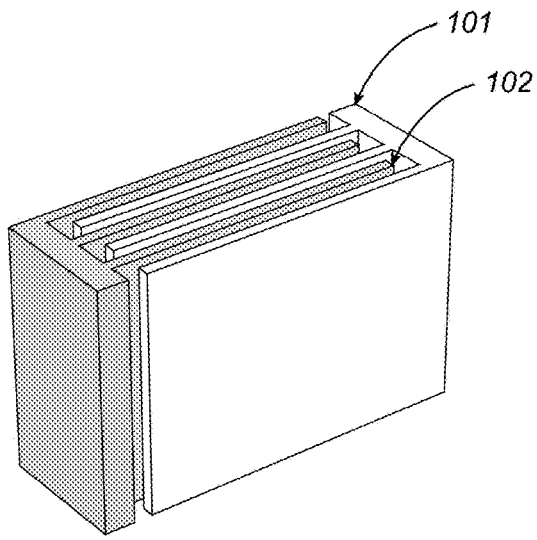
FIGS. 2A to 2E show the process of forming the recesses in the comb electrodes.
Figure 2B:
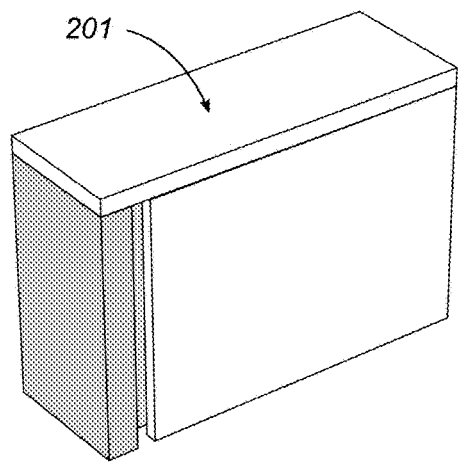
Figure 2C:
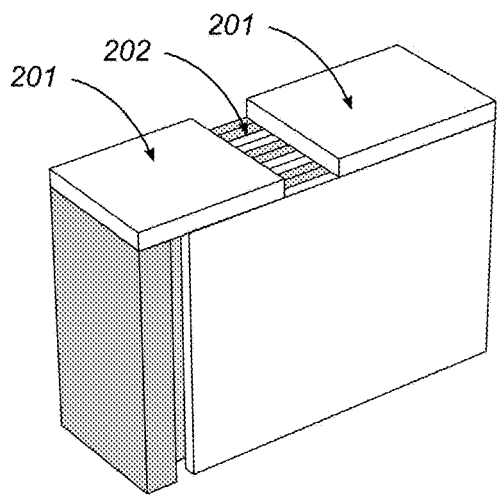
Figure 2D:
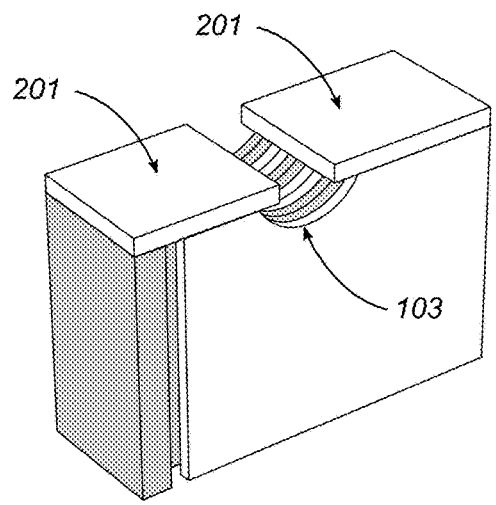
Figure 2E:
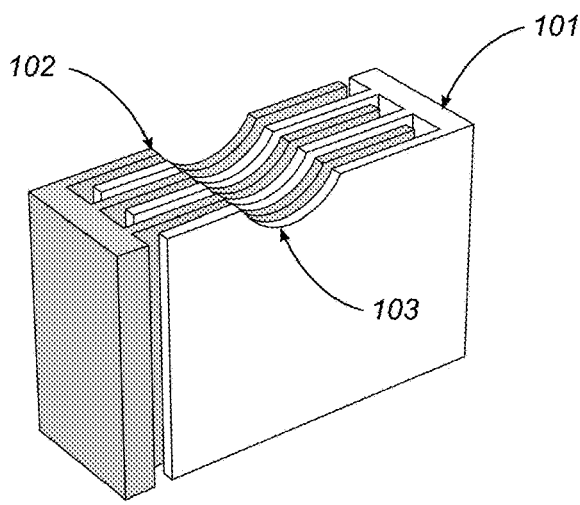

FIGS. 2A to 2E show the process of forming the recesses in the comb electrodes. At the first step, shown in FIG. 2A, the comb electrodes 101, 102 are formed in the normal manner for forming comb electrodes. In FIG. 2B, a resist 201 is formed over the comb electrodes. In FIG. 2C an opening 202 in the resist 201 is formed. The opening extends across the entire width of the comb electrodes along the Y-axis, i.e. perpendicular to the axis along which the comb fingers extend. In FIG. 2D, the comb fingers of the comb electrodes 101, 102 are etched through the opening 202 in the resist 201 to form the recesses 103. The etching process shown in FIG. 2D is an isotropic etching process, which forms a roughly semi-circular recess 103 in each comb finger, the recesses extending beneath the resist 201. It is also possible to use a dry etching process, which will form a rectangular recess 103 in each comb finger, or anisotropic etching, which will form a triangular recess 103 in each comb finger.

Figure 3:
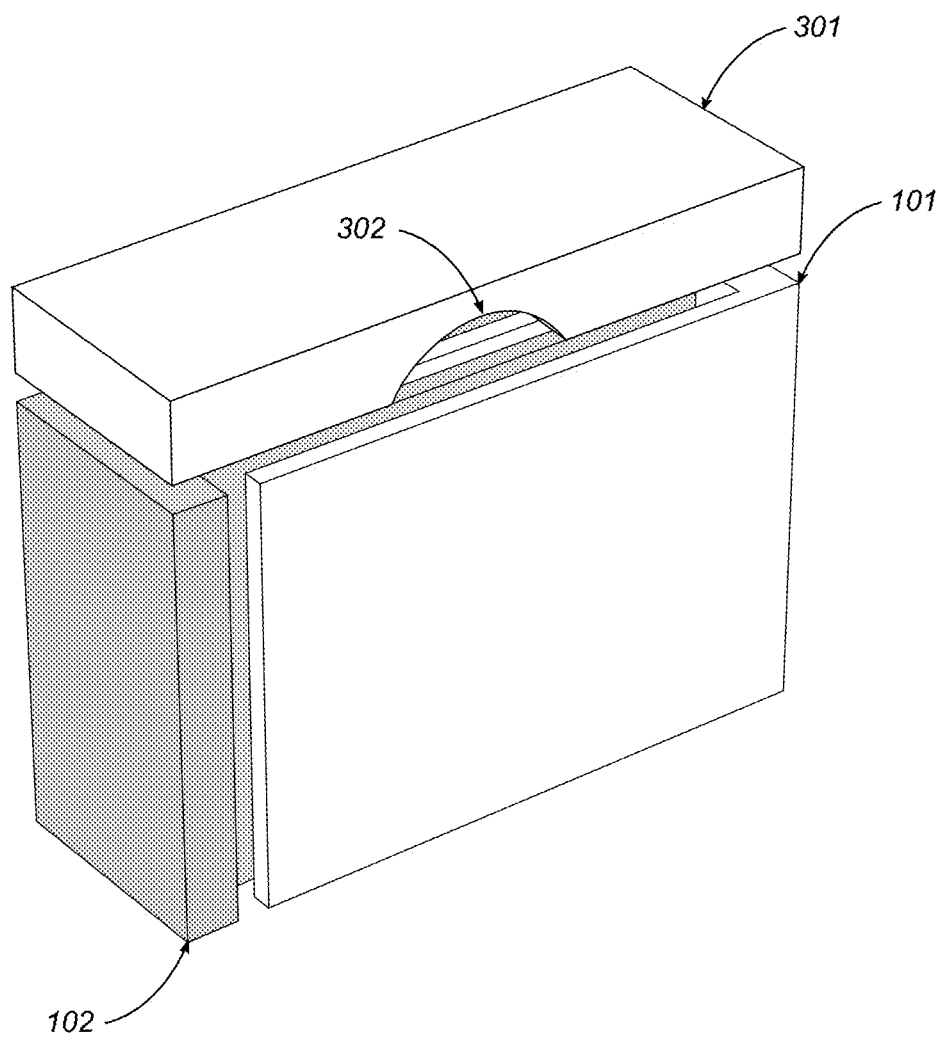
FIG. 3 shows an example of a recess in the cap wafer or handle wafer.

FIG. 3 shows an alternative embodiment in which the recess 103 of the embodiment shown in FIGS. 1 and 2 is replaced by a recess 302 which is formed in the cap wafer 301, when the distance from the top of the comb electrodes 101, 102 to the cap wafer 301 is smaller than the distance from the bottom of the comb electrodes 101, 102 to the handle wafer (not shown). Alternatively, when the separation between the comb electrodes 101, 102 and the handle wafer is smaller than the separation between the comb electrodes 101, 102 and the cap wafer, then the recess 302 may be present in the handle wafer, instead of the cap wafer 301. The recess 302 extends along the cap wafer 301 or handle wafer above or below the comb electrodes 101, 102, across the comb fingers of comb electrodes 101, 102 and opposite the comb electrodes 101, 102. While it is not essential for the recess 302 to run perpendicularly to the comb fingers, when the recess runs perpendicularly to the comb fingers, the symmetrical arrangement of the recess and comb fingers does not introduce asymmetric forces on the moveable comb electrode which might negatively affect measurement and control. Preferably, the recess 302 therefore extends across the comb fingers of comb electrodes 101, 102 in a direction perpendicular to the comb fingers.

The recess 302 extends at least the full width of the comb electrodes 101, 102, i.e. the recess 302 extends over every comb finger of the comb electrodes 101, 102, and may extend further than the full width of the comb electrodes 101, 102 in order to increase the size of the opening between the cap wafer 301/handle wafer and the comb electrodes 101, 102 into the space surrounding the comb electrodes 101, 102.

In a further embodiment of the invention, both the comb fingers comprise recesses 103 and the cap/handle wafer comprises a recess 302. The recesses 103 in the comb fingers are located opposite to and parallel to the recess 302 in the cap/handle wafer, thereby providing an enlarged channel through which gas can pass to/from the space surrounding the comb capacitor in to or out of the space between the comb electrodes 101, 102.

In a still further embodiment of the invention, both the comb fingers comprise recesses 103 and the cap/handle wafer comprises a recess 302. The recesses 103 in the comb fingers are located parallel to the recess 302 in the cap/handle wafer but offset from the recess 302, thereby providing a second channel through which gas can pass to/from the space surrounding the comb capacitor in to or out of the space between the comb electrodes 101, 102.

Indeed, a single comb capacitor may have multiple recesses 103 in the comb fingers or a recesses 302 in the cap wafer/handle wafer above/below the comb fingers, in which case the recesses 103/302 form channels that run generally parallel to each other and are separated along the axis of the comb fingers. While it is not essential for the channels to run parallel to one another, or perpendicularly to the comb fingers, when the channels to run parallel to one another and perpendicularly to the comb fingers, the symmetrical arrangement of the channels and comb fingers does not introduce asymmetric forces on the moveable comb electrode which might negatively affect measurement and control.

Within a single device, such as a MEMS accelerometer, which comprises multiple comb capacitors, some or all of the comb capacitors may include recesses 103 in the comb fingers or a recess 302 in the cap wafer/handle wafer above/below the comb fingers.

The invention claimed is:

1. A micro-electromechanical systems (MEMS) device comprising at least one comb capacitor, the comb capacitor comprising:
   a moveable electrode, the moveable electrode being moveable relative to fixed components of the MEMS device, the moveable electrode comprising a plurality of comb fingers;
   a fixed electrode, the fixed electrode being fixed relative to other fixed components of the MEMS device, the fixed electrode comprising a plurality of comb fingers, wherein the comb fingers of the moveable electrode are interdigitated with the comb fingers of the fixed electrode; and
   a handle wafer and a cap wafer, the handle wafer and the cap wafer being located on opposite sides of the moveable and fixed electrodes and extending parallel to the comb fingers of the moveable and fixed electrodes;
   wherein a gap between the moveable and fixed electrodes and the handle wafer is a first gap, and a gap between the moveable and fixed electrodes and the cap wafer is a second gap, wherein one of the first and second gaps is smaller than the other one,
   wherein one or both of:
   a) based on the second gap being smaller than the first gap, the sides of the comb fingers of the moveable and fixed electrodes which are opposite to the cap wafer include a first plurality of recesses; and based on the first gap being smaller than the second gap, the sides of the comb fingers of the moveable and fixed electrodes which are opposite to the handle wafer include a second plurality of recesses, wherein each recess of the first or second plurality of recesses extends along a portion of the length of the comb finger of the respective moveable electrode or fixed electrode; and
   b) based on the second gap being smaller than the first gap, the cap wafer includes first at least one recess opposite to the comb fingers of the movable and fixed electrodes; and based on the first gap being smaller than the second gap, the handle wafer includes second at least one recess opposite to the comb fingers of the movable and fixed electrodes, wherein each recess of the first or second at least one recess extends along a portion of the length of the respective cap wafer or handle wafer,
   wherein the first or second at least one recess or the first or second plurality of recesses provide a channel through which gas can move into or out of the space between the moveable electrode and fixed electrode and to or from the interior space of the MEMS device surrounding the comb capacitor.

2. The MEMS device of claim 1, wherein the comb fingers of the moveable and fixed electrodes include the first or second plurality of recesses, and wherein the first or second plurality of recesses are positioned on every comb finger of the comb capacitor such that the first or second plurality of recesses overlap along an axis perpendicular to the longitudinal axes of the comb fingers to provide the channel, and so that the channel runs across the full width of the comb capacitor fingers perpendicular to the longitudinal axes of the comb fingers.

3. The MEMS device of claim 1, wherein the second gap is smaller than the first gap and wherein the first plurality of recesses are formed on the sides of the comb capacitor fingers opposite to the cap wafer.

4. The MEMS device of claim 1, wherein the first gap is smaller than the second gap and wherein the second plurality of recesses are formed on the sides of the comb capacitor fingers opposite to the handle wafer.

5. The MEMS device of claim 1, wherein the first or second at least one recess is formed in b) the cap wafer or the handle wafer, and wherein the first or second at least one recess extends across the cap wafer or the handle wafer opposite to the comb capacitor fingers across at least the full width of the comb capacitor fingers and perpendicular to the longitudinal axes of the comb capacitor fingers.

6. The MEMS device of claim 1, wherein the second gap is smaller than the first gap and wherein the first at least one recess is formed on the cap wafer.

7. The MEMS device of claim 1, wherein the first gap is smaller than the second gap and wherein the second at least one recess is formed on the handle wafer.

8. The MEMS device of claim 1, wherein one or both of:
   a) based on the second gap being smaller than the first gap the comb fingers of the moveable and fixed electrodes include a third plurality of recesses on the sides of the comb fingers of the moveable and fixed electrodes which are opposite to the cap wafer, and based on the first gap being smaller than the second gap the comb fingers of the moveable and fixed electrodes include a fourth plurality of recesses opposite to the handle wafer,
   b) based on the second gap being smaller than the first gap the cap wafer includes a third recess; and based on the first gap being smaller than the second gap the handle wafer includes a fourth recess, wherein the third or fourth recess or the third or fourth plurality of recesses provide a second channel through which gas can move in or out of the space between the moveable electrode and fixed electrode and to or from the interior space of the MEMS device surrounding the comb capacitor, and wherein the second channel extends parallel to and is offset from the first channel.

9. The MEMS device of claim 1, wherein the comb capacitor is a damping capacitor.

10. The MEMS device of claim 1, wherein the comb capacitor is a sense capacitor.

11. The MEMS device of claim 1, wherein the comb fingers of the moveable and fixed electrodes include recesses and the cap wafer or handle wafer includes a recess, and wherein the recess in the cap wafer or handle wafer is positioned opposite to the recesses in the comb fingers of the moveable and fixed electrodes such that the recesses in the comb fingers and the recess in the cap or handle wafer form the channel.

12. The MEMS device of claim 1, wherein the MEMS device comprises a plurality of comb capacitors and wherein two or more of the comb capacitors comprise:
  a moveable electrode, the moveable electrode being moveable relative to fixed components of the MEMS device, the moveable electrode comprising a plurality of comb fingers;
  a fixed electrode, the fixed electrode being fixed relative to other fixed components of the MEMS device, the fixed electrode comprising a plurality of comb fingers, wherein the comb fingers of the moveable electrode are interdigitated with the comb fingers of the fixed electrode; and
  a handle wafer and a cap wafer, the handle wafer and the cap wafer being located on opposite sides of the moveable and fixed electrodes and extending parallel to the comb fingers of the moveable and fixed electrodes;
  wherein a gap between the moveable and fixed electrodes and the handle wafer is a first gap, and a gap between the moveable and fixed electrodes and the cap wafer is a second gap, wherein one of the first and second gaps is smaller than the other one,
  wherein one or both of:

a) based on the second gap being smaller than the first gap the sides of the comb fingers of the moveable and fixed electrodes which are opposite to the cap wafer include a first plurality of recesses, and based on the first gap being smaller than the second gap the sides of the comb fingers of the moveable and fixed electrodes which are opposite toor the handle wafer include a second plurality of recesses; and b) based on the second gap being smaller than the first gap the cap wafer includes a first recess opposite to the comb fingers of the movable and fixed electrodes, and based on the first gap being smaller than the second gap, the handle wafer includes a second recess opposite to the comb fingers of the movable and fixed electrodes;

wherein the first or second recess or the first or second plurality of recesses provide a channel through which gas can move in or out of the space between the moveable electrode and fixed electrode and to or from the interior space of the MEMS device surrounding the comb capacitor.

13. The MEMS device of claim 1, wherein one or both of:

a) the comb fingers of the moveable and fixed electrodes include a plurality of further recesses; and b) the cap wafer or handle wafer includes a plurality of further recess;

wherein the further recess or recesses provide a one or more further channels through which gas can move in or out of the space between the moveable electrode and fixed electrode and to or from the interior space of the MEMS device surrounding the comb capacitor, and wherein the further channel or channels extend parallel to and is/are offset from the first channel.

* * * * *